(12) United States Patent
Mannes Hillesheim et al.

(10) Patent No.: US 11,334,108 B2
(45) Date of Patent: May 17, 2022

(54) MODULAR INTERLEAVING TECHNIQUES FOR SCALABLE POWER ELECTRONICS CONVERTER

(71) Applicants: NXP USA, Inc., Austin, TX (US); INSTITUT NATIONAL POLYTECHNIQUE DE TOULOUSE, Toulouse (FR)

(72) Inventors: Miguel Mannes Hillesheim, Toulouse (FR); Marc Michel Cousineau, Lavaur (FR); Eric Pierre Rolland, Grepiac (FR); Philippe Goyhenetche, Fonsorbes (FR); Guillaume Jacques Léon Aulagnier, Toulouse (FR)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/205,041

(22) Filed: Mar. 18, 2021

(65) Prior Publication Data

US 2021/0333819 A1    Oct. 28, 2021

(30) Foreign Application Priority Data

Apr. 22, 2020   (EP) .................................... 20305395

(51) Int. Cl.
| | | |
|---|---|---|
| *H03K 5/00* | (2006.01) | |
| *G06F 1/04* | (2006.01) | |
| *H03K 5/01* | (2006.01) | |

(52) U.S. Cl.
CPC ................. *G06F 1/04* (2013.01); *H03K 5/01* (2013.01); *H03K 2005/00013* (2013.01)

(58) Field of Classification Search
CPC .. G06F 1/04; H03K 5/01; H03K 2005/00013; H02M 3/1586; H02M 3/1584
(Continued)

(56) References Cited

U.S. PATENT DOCUMENTS

| | | |
|---|---|---|
| 7,394,232 B2 | 7/2008 | Hendrix et al. |
| 8,120,203 B2 | 2/2012 | Heineman et al. |

(Continued)

FOREIGN PATENT DOCUMENTS

| | | |
|---|---|---|
| JP | 2000-312442 A | 11/2000 |
| WO | 2017/205098 A1 | 11/2017 |

OTHER PUBLICATIONS

Texas Instruments, "TPS40140 Dual or 2-Phase Stackable Controller," TPS40140 Data Sheet, SLUS6601, Sep. 2005, Revised Jan. 2015; 71 pages.

(Continued)

*Primary Examiner* — Ryan Jager

(57) ABSTRACT

A power management integrated circuit comprises a modular interleaved clock generator comprising a plurality of interconnected modular elements, each element constructed to generate and output a clock signal, and each one comprising: a phase port high input; a phase port low input; a clock input; and a bypass switch coupled between the phase port high input and the phase port low input, wherein in response to the bypass switch of at least one of the plurality of elements in a closed state, the phase port high inputs or the phase port low inputs of the remaining elements absent the at least one interleaving controller having the bypass switch in the closed state each receives a voltage that interleaves the clock signals output from the remaining active elements to have an interleaving arrangement that includes equal phase delays.

19 Claims, 13 Drawing Sheets

(58) Field of Classification Search
USPC .......................................................... 327/293
See application file for complete search history.

(56) References Cited

U.S. PATENT DOCUMENTS

| | | |
|---|---|---|
| 2004/0123167 A1 | 6/2004 | Chapuis |
| 2010/0201405 A1* | 8/2010 | Ahmad ............. H02M 3/33561 327/108 |
| 2011/0169471 A1* | 7/2011 | Nagasawa ............... H01L 24/37 323/283 |
| 2015/0326021 A1 | 11/2015 | Cousineau |
| 2018/0123443 A1 | 5/2018 | Sreenivas et al. |
| 2021/0028704 A1* | 1/2021 | Jiang ................... H02M 3/1584 |
| 2021/0167780 A1* | 6/2021 | Mannes Hillesheim . G06F 1/08 |
| 2021/0333819 A1* | 10/2021 | Mannes Hillesheim . G06F 1/04 |

OTHER PUBLICATIONS

Texas Instruments, "TPS543C20 4 Vin to 16 Vin, 40-A Stackable, Synchronous Step-down SWIFT Converter with Adaptive Internal Compensation," TPS543C20 Data Sheet, SLUSCD4, Mar. 2017; 48 pages.

U.S. Appl. No. 17/109,877, "Distributed Interleaving Control of Multiphase SMPCS," filed Dec. 2, 2020, 31 pages.

Cousineau et al; "Triangular Carrier Self-Alignment Using Modular Approach for Interleaved Converter Control" Proceedings of the 2011 14th European Conference on Power Electronics and Applications; Birmingham, UK, 10 pages (Sep. 15, 2011).

Garcia et al; Effect of the Tolerances in Multi-Phase DC-DC Converters; IEEE 36th Power Electronics Specialists Conference; IEEE; 6 pages (2005).

Gateau et al; "Digital Implementation of Decentralized Control for Multilevel Converter"; IEEE Xplore; 6 pages (Sep. 11, 2017).

Hegarty, Timothy; Current-Mode Control Stability Analysis For DC-DC Converters (Part 1); How2Power Today; 7 pages (Jun. 2014).

International Rectifier; "IR3081PBF Datasheet"; retreived from the Internet http://www.irf.com/product-info/datasheets/data/ir3081pbf.pdf; 40 pages Nov. 30, 2020.

Rajini et al; "Design and Implementation of Runtime Reconfigurable High Resolution Digital Pulse Width Modulator on FPGA"; Int'l J. of Innovative Research in Science, Engineering and Technology, vol. 3, Issue 4; 8 pages (Apr. 2014).

ShareTechnote; "Electronics—PLL"; retrieved from the Internet http://www.sharetechnote.com/html/Electronics_PLL.html ; 4 pages (Apr. 11, 2019).

Texas Instruments; "TPS53647 4-Phase, D-CAP+, Step-Down, Buck Controller with NVM and PMBus Interface for ASIC Power and High-Current Point-of-Load"; 123 pages (Feb. 2017).

Notice of Allowance for U.S. Appl. No. 17/109,877, 8 pgs., (dated Jan. 10, 2022).

* cited by examiner

MODULAR INTERLEAVING TECHNIQUES FOR SCALABLE POWER ELECTRONICS CONVERTER

FIELD

The present disclosure relates generally to multicell converters such as multilevel and multiphase power converters and its associations, and more specifically to scalable interleaving arrangements for multicell converters.

BACKGROUND

Modern small electronics often include modular converters, often referred to as scalable or stackable converters. Modular converter architectures including flying capacitor or multiphase configurations or the like may implement phase shifted (PS) carrier based pulse width modulation (PWM) to provide an even power distribution with lower distortion among the cells of the converter. A cell may be referred to as the "power portion" of a converter, and may include a combination of a switching cell (or two power switches), power switch drivers, a storage component such as an inductor or capacitor, and a PWM signal generator configured to receive a local clock signal. PS-PWM used with a multicell converter offers additional features such as reduced output ripple and lower switching losses and harmonic pollution resulting in the need for smaller harmonic filters while achieving better harmonic performance over other modulation techniques.

PS-PWM is normally obtained using interleaved carriers, or control signals with equally spaced phase delays. The phase delay is dependent on the number of cells, or 360°/N where N is the number of cells, which can generate an equivalent stepped multilevel output waveform with lower distortion across the cells of the multicell converter.

FIG. 1 is a graph 100 illustrating an example of a PS-PWM implementation for a conventional multilevel converter, for example, operating as a DC/AC inverter or the like. Here, the converter provides three interleaved and phase-shifted triangular carrier signals and three PS-PWM signals (SP1, SP2, SP3) having phase delays of 0°, 120°, and 240°. The combined signal $\mu_{out}$ has a frequency that is three times greater than each PWM signal due to the interleaving arrangement.

However, conventional multicell systems or the like cannot be reconfigured during operation. For example, the interleaving arrangement required to generate the PS-PWM signals cannot be modified during operation if a cell of the converter is disabled, not operational, or unable to process a PS-PWM signal. For example, where signal SP3 cannot be generated, only signals SP1 and SP2 are processed by the fixed hardware, e.g., defined by a resistor configuration or the like. Since the phase delays are provided by non-configurable hardware, e.g., defined by a resistor value, the phase delays cannot be adjusted notwithstanding the lack of availability of the signal SP3.

SUMMARY

Aspects of the disclosure are defined in the accompanying claims.

In a first aspect, there is provided a power management integrated circuit comprising a modular interleaved clock generator comprising a plurality of interconnected modular elements, each element constructed to generate and output a clock signal, and each one comprising: a phase port high input; a phase port low input; a clock input; and a bypass switch coupled between the phase port high input and the phase port low input, wherein in response to the bypass switch of at least one of the plurality of elements in a closed state, the phase port high inputs or the phase port low inputs of the remaining elements, absent the at least one elements having the bypass switch in the closed state, each receives a voltage that interleaves the clock signals output from the remaining active elements to have an interleaving arrangement that includes equal phase delays.

In one or more embodiments, the modular interleaved clock generator may further comprise: a resistor ladder including a plurality of serially coupled resistors; and a voltage source that provides a supply voltage to the resister ladder, wherein each resistor of the resistor ladder is coupled to an element of the plurality of interconnected elements.

In one or more embodiments, each resistor of the resistor ladder may be parallel to the bypass switch of an interleaving controller of the plurality of elements to which the resistor ladder is coupled so that the phase port high input of the interleaving controller is coupled to the resistor ladder at one side of the resistor and the phase port low input of the interleaving controller is coupled to the resistor ladder at another side of the resistor.

In one or more embodiments, the power management integrated circuit may further comprise a direct connection between the phase port high input, phase port low input, and bypass switch of the at least one of the plurality of elements having the bypass switch in the closed state and a resistor of the resister ladder coupled to the at least one of the plurality of elements, and the bypass switch and the resistor may be external to or integrated with the at least one of the plurality of elements.

In one or more embodiments, each of the plurality of elements may have a clock signal output constructed and arranged to output the clock signal at a phase delay that forms the interleaving arrangement in response to a clock source that provides an input clock to each clock input.

In one or more embodiments, an interleaving controller of the plurality of elements may be converted from a slave interleaving controller to the master interleaving controller to output its clock signal from the bidirectional clock input/output interface to the other interleaving controllers when its clock signal is in phase with an external clock signal previously received by the clock inputs of the plurality of interleaving controllers.

In one or more embodiments, the at least one of the plurality of elements may have an internal phase lock loop that generates the clock signal at a same frequency as a clock signal at the clock input.

In one or more embodiments, the at least one of the plurality of elements having the bypass switch in the closed state may control the remaining elements to rearrange the clock signals to form the interleaving arrangement that includes the equal phase delays.

In one or more embodiments, the power management integrated circuit may further comprise an external signal source that generates an enable bypass signal that controls a transition of the bypass switch between an open state and the closed state.

In one or more embodiments, the phase port high input may form the phase delays of the clock signals.

In one or more embodiments, the phase port low input may form the phase delays of the clock signals.

In one or more embodiments, a difference of the phase port high input and phase port low input may indicate the number of active elements and the value of a relative phase delay.

In one or more embodiments, one of the elements may include a clock master interleaving controller that provides the clock signal to other elements of the plurality of elements, and when the clock master interleaving controller is inactive, another element of the other elements having a phase low voltage at its phase port low input equal to a ground voltage automatically may send its clock signal to the other elements.

In one or more embodiments, one of the elements may include a master interleaving controller that provides the clock signal to the other elements, and when the master interleaving controller is inactive, another elements of the other elements having a phase high voltage at its phase port high input equal to a ground voltage automatically may send its clock signal to the other elements.

In a second aspect, there is provided an interleaving controller of a clock generator of a power management integrated circuit, comprising: a phase port high input; a phase port low input; a clock input; and a bypass switch coupled between the phase port high input and the phase port low input, wherein in response to the bypass switch in a closed state, the converter includes a direct connection between the phase port high input, phase port low input, and bypass switch to modify an interleaving arrangement including one or more other interleaving controllers in electronic communication with the interleaving controller.

In one or more embodiments, the interleaving arrangement may include equal phase delays of clocks generated by the other interleaving controllers.

In one or more embodiments, the interleaving controller may further comprise a clock signal output constructed and arranged to output a clock signal in response to a signal received at the clock input.

In one or more embodiments, the interleaving controller may be converted from a slave interleaving controller to a master interleaving controller to output the clock signal from the clock input to the other interleaving controllers when the clock signal is in phase with an external clock signal previously received by the clock inputs of the plurality of interleaving controllers.

In a third aspect, there is provided a method for forming a reconfigurable hardware interleaving arrangement for a power management integrated circuit, comprising: outputting a first clock signal to a plurality of slave interleaving controllers; generating a plurality of second clock signals having a phase delay relative to the first clock signal; activating a bypass switch of at least one of the slave interleaving controllers; and reconfiguring an interleaving arrangement including the phase delays of the second clock signals in response to activating the bypass switch.

In one or more embodiments, reconfiguring the hardware interleaving arrangement may further comprise hanging one of the plurality of slave interleaving controls to a master among the interleaving controllers.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Conventional converters may include a combination of master and slave interleaving controllers (ICs) stacked together to produce a plurality of desired phase shifted clocks for associated converters.

Figure 1:
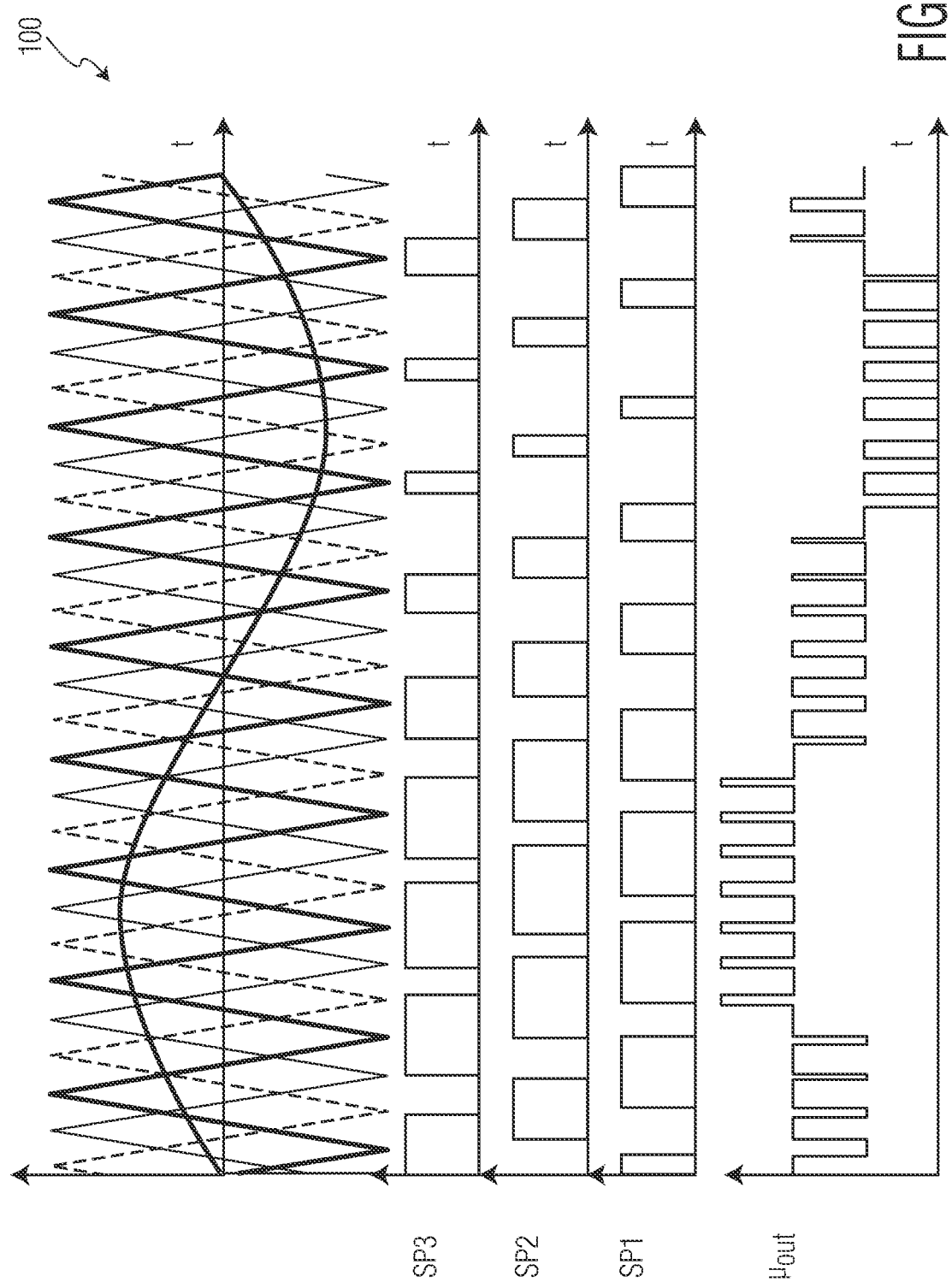
FIG. 1 is a graph illustrating an interleaving arrangement for a conventional multilevel converter.
Figure 2:
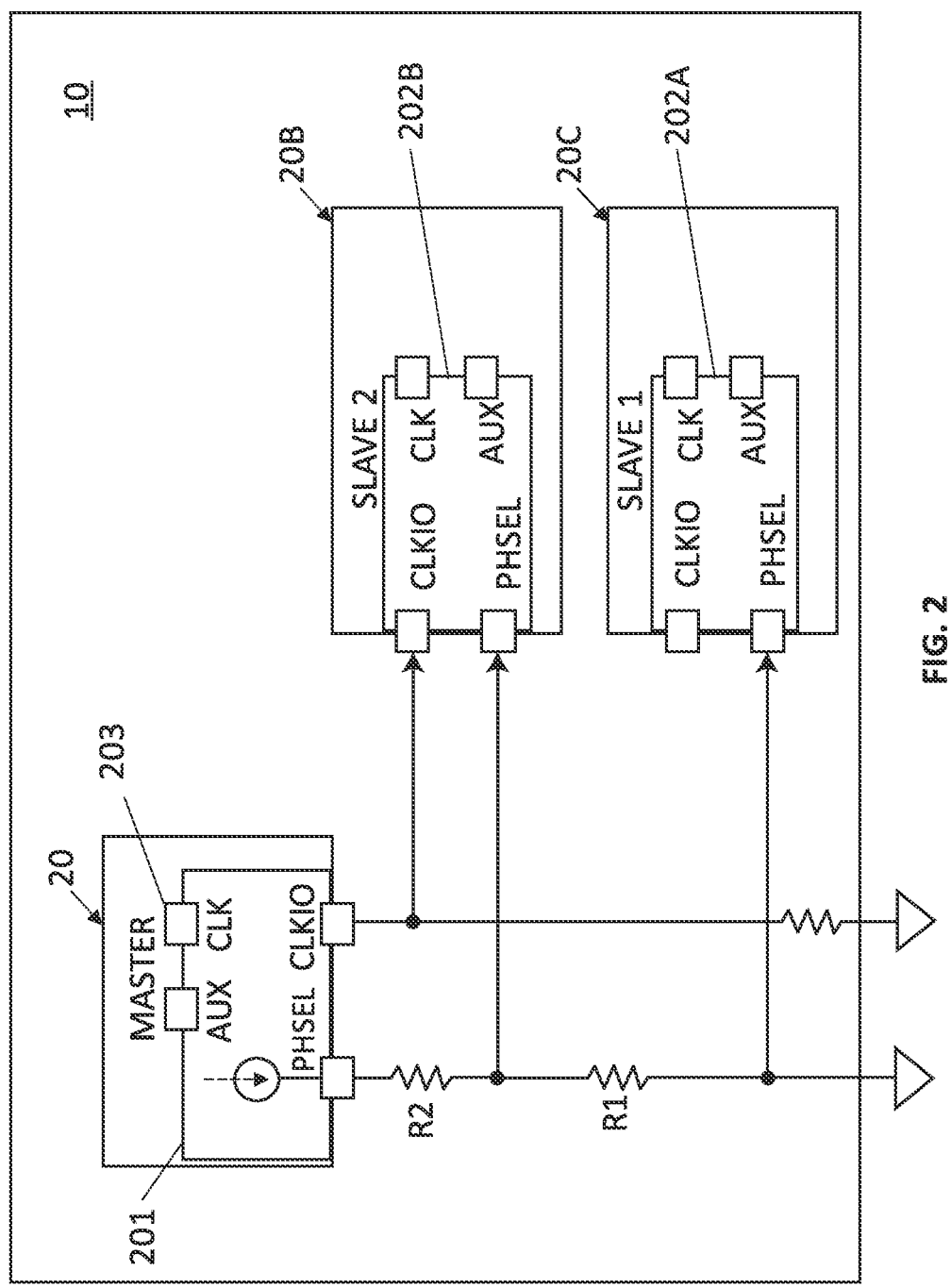
FIG. 2 is a schematic circuit diagram of a power management integrated circuit (PMIC) comprising a plurality of stackable buck controllers, each with interleaving controller (IC) connections.

For example, referring to FIG. 2, a power management integrated circuit (PMIC) 10 includes a plurality of stackable buck controller modules 20, 20A, 20C. The PMIC 10 may include a processor core, memory, input/output (I/O), and peripheral components (not shown) that receive a direct power supply from the ICs 201, 202A, 202B of the modules 20, 20A, 20B. The PMIC 10 can be implemented in various automotive, industrial, and consumer applications, and perform various battery management, voltage regulation, switching, and charging functions.

The ICs 201, 202A, 202B of the modules 20, 20A, 20B, can be constructed as a master or a slave. Accordingly, all modules are constructed and arranged to include equal ICs. Each module is a complete converter on itself. However, the modules can be stackable, scalable, modular, or the like because each module can be associated with modules having similar or same configurations. A feature is that a module in such configurations can be removed without prejudice to the other modules.

Each IC 201, 202A, 202B has an internal clock generator that provides an internal phase shifted clock CLK 203. In this particular case, each module 20, 20A, 20B has two phases, or current outputs or legs, controlled in phase opposition. For purposes of this example, module 20 is referred to as a "master" and modules 20A, 20B are referred to as "slaves."

In an operation mode of the module 20 in FIG. 2, the master IC 201 sends a clock signal (CLKIO) to all slaves 202A, 202B (generally, 202). The master 201 imposes a predetermined current on the resistor network R1, R2 extending between the master 201 and slaves 202 to provide a specified voltage on the PHSEL inputs of the ICs 201, 202, respectively. The resulting voltage values at the PHSEL inputs are sensed by the internal IC. Accordingly, each slave IC 202 delays the proper amount of time the local CLK to be in agreement with the multiphase converter's interleaved operating mode. The PHSEL input can be read by an analog digital converter and an electronic apparatus delays the local clock CLK to generate the PS-PWM signal. Accordingly, the conventional electronic apparatus shown and described in FIG. 2 is often limited to generate a strict number of phase delays.

Figure 3A:
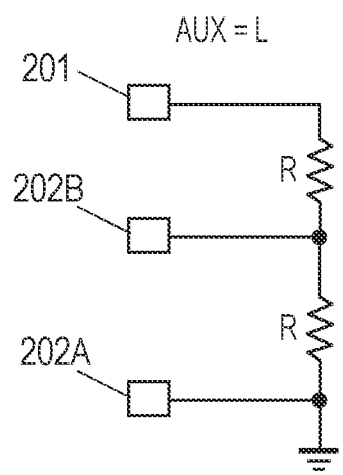
FIGS. 3A and 3B are diagrams illustrating a phase delay arrangement of a conventional modular master-slave six (6) phase controller of FIG. 2 changing an operation mode depending on a phase selection input voltage.
Figure 3B:
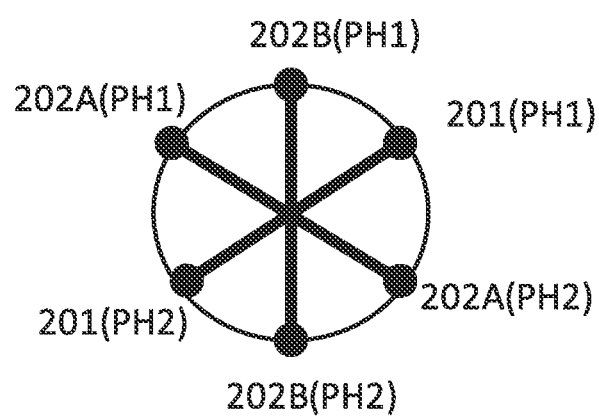

FIGS. 3A and 3B are diagrams illustrating an interleaving phase delay arrangement of a conventional six-phase controller shown in the PMIC 10 of FIG. 2 capable of processing a voltage that changes an operation mode depending on a phase select voltage.

For example, in a six-phase configuration including the master 201 and two slaves 202A, 202B, the points on the circle illustrated in FIG. 3B represent the equally spaced phase delay of each PWM signal. As described herein, a system on chip (SoC) or the like may be an example of a "module," which as explained above can include an IC and cells. Accordingly, in some embodiments, a SoC is a converter composed by a control scheme, a switching-cell comprising two power switches, and, in some cases, filtering elements. Such converters can be scalable, i.e., formed of multiple interoperable modules.

Figure 4A:
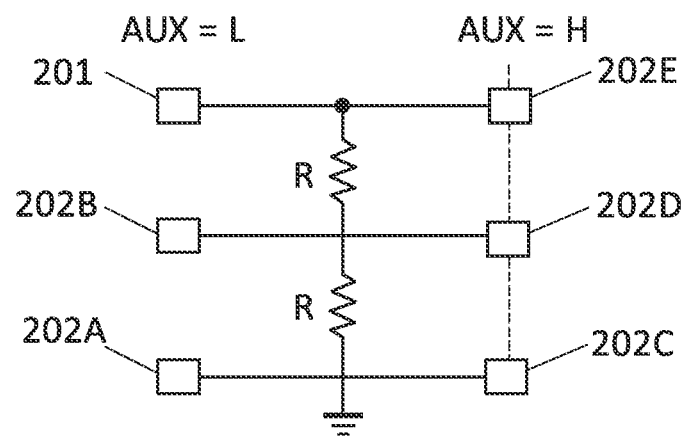
FIGS. 4A and 4B are diagrams of the same conventional controller of FIG. 2 operating with twelve phases.
Figure 4B:
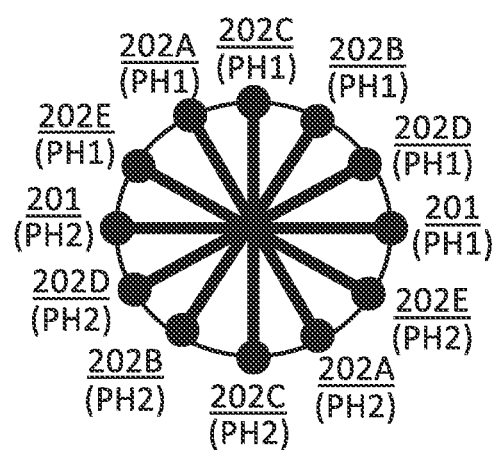

Similarly, as shown in the twelve-phase configuration of FIGS. 4A and 4B, the points on the circle illustrated in FIG. 4B are equally spaced. However, an additional input is required to operate at twelve phases. In particular, slaves 202C, 202D, and 202E require the auxiliary input AUX to be at a different level, e.g., different voltage, than that of the master 201 and slaves 202A and 202B. The AUX level is defined by a device connection during the hardware construction. The AUX level equal to high 'H' (e.g., 1.8V-VDD) instead of 'L' (e.g., 0-0.8V), adds a 30° additional phase delay to ensure PS-PWM. Also, the auxiliary input AUX provides an additional phase delay to the ICs 200C-E in FIG. 4A to differentiate their phase delay from interleaving controllers 201, 202A, B.

Figure 5A:
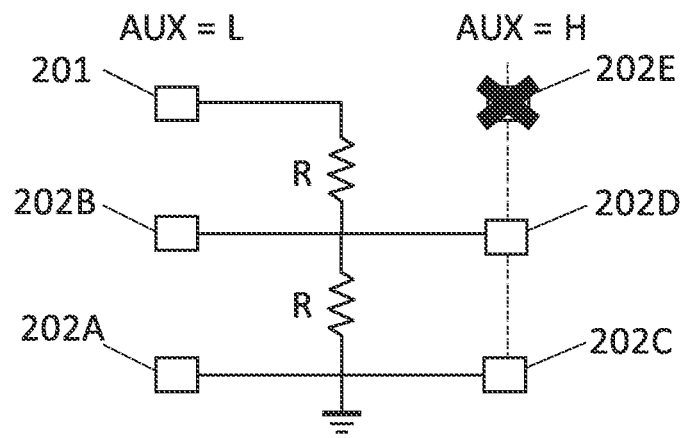
FIGS. 5A and 5B are diagrams illustrating the controller of FIGS. 4A and 4B operating with ten phases due to an unavailable or not required slave module.
Figure 5B:
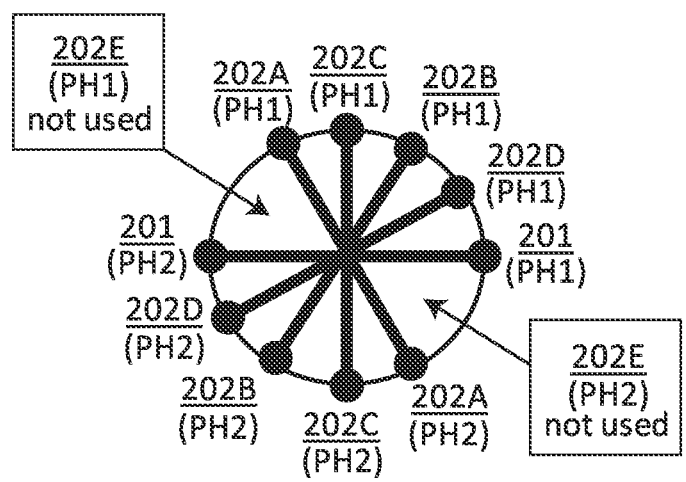

FIGS. 5A and 5B are diagrams illustrating the controller of FIGS. 4A and 4B operating with ten (10) phases. As previously described, PS-PWM is normally obtained using control signals with equally spaced phase delays. However, the controller of FIGS. 5A and 5B illustrate phase delays that are not equally spaced because slave 202E is missing, not used, experiencing a failure, or otherwise not available or operational. The unequal phase spacing causes sub-harmonic oscillations that generally require an oversized and therefore undesirable output filter to comply with ripple constraints.

In brief overview, embodiments of the present inventive concepts provide a modular interleaving approach for stackable multicell converters where optimal interleaving can be achieved for any number of phases and allow reconfiguration to occur during operation instead of being defined in hardware such as resisters. In some embodiments, scalable and reconfigurable interleaving techniques required to generate PS-PWM signals are performed by local decisions using associated various modular converters or the like, in particular, executed by the ordinary interleaving controller(s) and not necessarily the master interleaving controller.

These local decision functions permit the ordinary interleaving controller(s) to perform dynamic reconfigurations of a converter with respect to optimal interleaving when an ordinary module fails or is otherwise inactive or unavailable. Since local decisions are not required to be performed by a master interleaving controller, a master interleaving controller in some embodiments is not required for providing clock signals for interleaving.

Figure 6A:
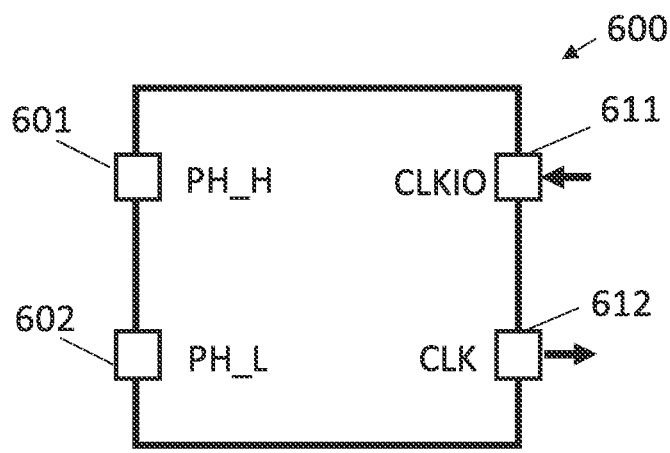
FIG. 6A is a block diagram of an IC in a modular converter to generate an interleaved clock, in accordance with an example embodiment of the present disclosure.

FIG. 6A is an interleaving controller (IC) 600 for a modular converter, in accordance with some embodiments. In some embodiments, the interleaving controller 600 is part of the PMIC 10 of FIG. 2, and can therefore apply to various automotive, consumer, or industrial applications, but not limited thereto. For reasons described herein, the interleaving controller 600 is an inventive improvement over the controllers 201, 202 illustrated and described with respect to FIGS. 2-5. The interleaving controller 600 can include one or more semiconductor materials connected to form an electrical circuit, or more specifically, a converter cell or the like that can be connected to form a buck converter or the like or associated with one or more other cells to form a multicell converter or the like. In some embodiments, the interleaving controller 600 composes the converter's control scheme, along with the other necessary control elements. The interleaving controller 600 can be included in a module or other collection of electronic circuits comprising one or more cells, or more specifically, switching-cells, converter/inverters, or the like. In some embodiments, the interleaving controller 600 is part of a computer motherboard or the like. In some embodiments, the interleaving controller 600 may operate as part of a power converter controller such as a buck or boost regulator of a PMIC or the like, but not limited thereto. In some embodiments, the interleaving controller 600 may be configured and arranged to function as a clock master device ("master") or a clock slave device ("slave").

Figure 6B:
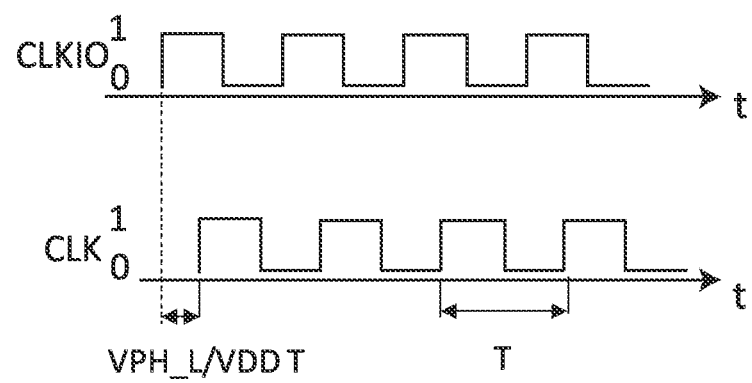
FIG. 6B is a graph illustrating waveforms of an input clock and an output clock, respectively, of the IC of FIG. 6A.

The interleaving controller 600 includes a phase port high input (PH_H) 601, a phase port low (PH_L) input 602, a clock (CLKIO) input 611 and a clock (CLK) output 612. In some embodiments, the interleaving controller 600 includes an internal phase lock loop (PLL) that generates the clock signal CLK at a same frequency as the clock signal CLKIO (see FIG. 6B), having a period (T)=1/f with a time delay $V_{PH\_L}/V_{DD}$ T, where $V_{DD}$ is the supply voltage and $V_{PH\_L}$ is the voltage at the phase port low input 602.

Figure 7A:
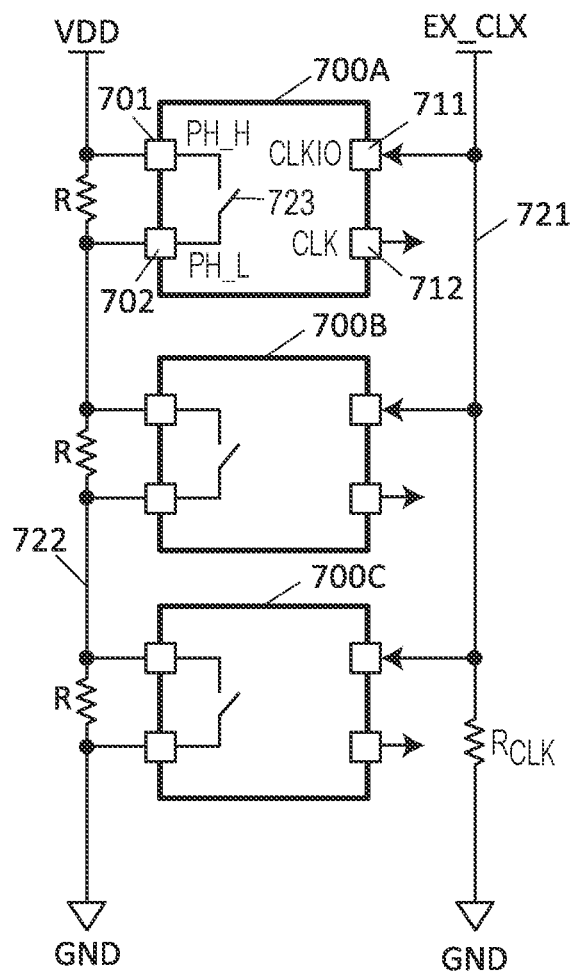
FIG. 7A is a schematic circuit diagram of an interleaving arrangement having three ICs, in accordance with an example embodiment of the present disclosure.
Figure 8B:
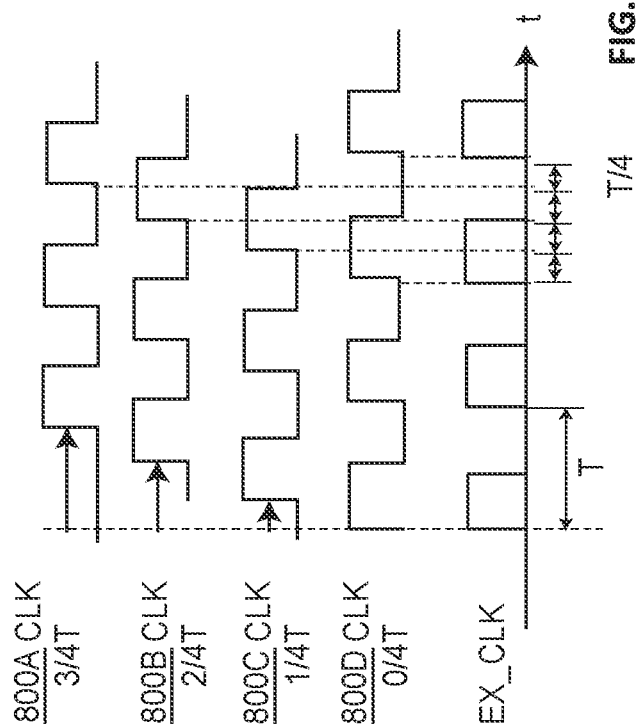
FIG. 8B are illustrations of interleaved clock signal waveforms produced by the interleaving arrangement of FIG. 8A.
Figure 8A:
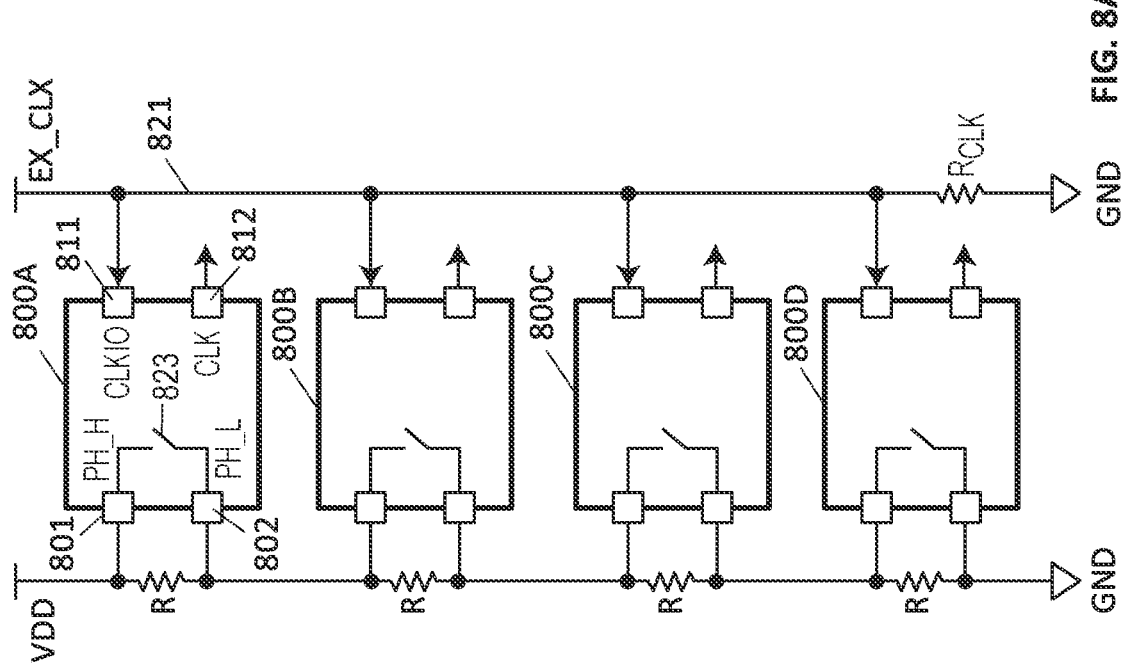
FIG. 8A is a schematic circuit diagram of an interleaving arrangement having four ICs, in accordance with an example embodiment of the present disclosure.

As shown in the schematic diagrams of FIGS. 7A and 8A, various associations with different element number are possible to generate the required number of PS CLK signals. In FIG. 7A, three slave elements 700A, 700B, 700C of an interleaving converter or controller are illustrated, which can be similar to or the same as elements of the interleaving controller 600 of FIG. 6. In some embodiments, the elements 700 are constructed and arranged as switching-cells, or cells, of a multicell converter or the like for providing a desired control of the converter. FIG. 8A is likewise similar to interleaving controller 600 of FIG. 6, except that four slave elements 800A, 800B, 800C, 800D (generally, 800) are illustrated. In some embodiments, the elements 700, 800 are part of a modular interleaved clock generator of a PMIC or the like, for example, the PMIC 10 illustrated and described with respect to FIG. 2.

Referring again to FIG. 7A, a conductive connector 721 such as a metal wire is coupled to each CLKIO input 711 for transmitting a clock signal EX_CLK to all slave elements 700A-700C (generally, 700). The clock signal EX_CLK is provided between slave elements 700 instead of generated by a master element, for example, shown in a conventional arrangement of FIG. 2. In some embodiments, the conductive connector 721 includes a clock resistor $R_{CLK}$ for providing clock termination for the clock signal EX_CLK driving the circuit load.

The phase port high input 701 and phase port low input 702 of each element 700 is coupled to a common voltage source line 722, or node, such as a metal wire or the like. For each element 700, one or more resistors R and a bypass switch 723 can form a voltage loop, or direct connection, to connect the phase port high input 701 and phase port low input 702. The resistors R and interleaving controller bypass switches 723 can be integrated or external with respect to the element 700.

Figure 7B:
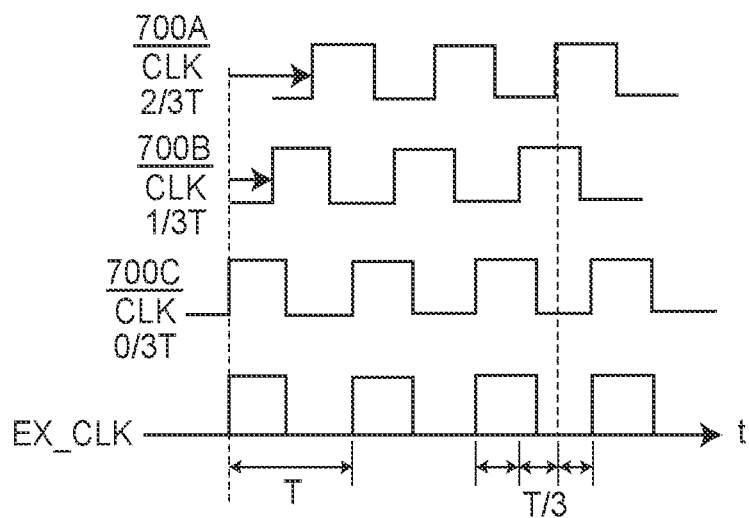
FIG. 7B are illustrations of interleaved clock signal waveforms produced by the interleaving arrangement of FIG. 7A.

Each element 700 also has a clock output 712 for outputting a clock signal CLK having a predetermined phase relative to the other elements, for example, shown in FIG. 7B. The clock signals CLK of the elements 700 are interleaved to provide a combined signal having a frequency that is greater than each individual clock signal due to the interleaved arrangement. However, in the event of a failure or otherwise the presence of an unavailable or inoperable elements 700 in the configuration, the clock signals CLK can be automatically interleaved in a different arrangement such that the unavailable or inoperable elements is bypassed and the clock signals CLK output from the remaining elements to have equal phase delays.

In some embodiments, the bypass switch 723 is controlled by an enable bypass signal (EN_BP). The enable bypass signal (EN_BP) may be provided by an external signal source 902 (see FIG. 9A), which generates enable bypass signal (EN_BP) in response to a sensor signal or the like indicating a state of the corresponding slave 700. For example, a signal source may communicate with or be part of a voltage sensor slave 700C that detects that the slave 700C is receiving a voltage having a value that exceeds a threshold. Here, the voltage sensor can notify the external signal source, which in turn outputs an enable bypass signal EN_BP that closes the switch 723 so that the slave 700C is no longer part of the association of other slave elements 700A, 700B. The converter in FIG. 7A is reconfigured automatically by a combination of the enable signals (EN_EP) and resistor ladder formed of resistors R in series with each other along the voltage source line 722 but each resistor R in parallel with an interleaving controller bypass switch 723 to generate interleaved signals that provide a desirable equally spaced phase delay, for example, shown in FIG. 7B. More specifically, to reconfigure, the bypass switch 723 connects the node 722 directly to ground GND so that interleaving controller 700C is non-existent with respect to the reconfiguration. Here, the phase port high inputs 701 and low inputs 702 of the elements 700 are coupled to the voltage source line 722 such that the voltage loop includes a resistor R of the resistor ladder, where output voltages, phase high (PH_H) and phase low (PH_L) voltages, at the inputs 701, 702, respectively, are fractions of the supply voltage $V_{DD}$. The PH_H and PH_L voltage pins permit each element 700 to recognize a number (N) of active elements, e.g., modules, as well as its own position (or rank) in the chain. Then, the appropriate phase shift can therefore be computed and implemented.

The phase port low (PH_L) inputs 702 present voltage ratios that are used to select the carriers' phase delays, and generate the interleaving arrangement, i.e. control signals with equally spaced phase delays dependent on the number of interleaving controllers used normally equals to 360°/N, of the three interleaving controllers shown in FIG. 7A. The interleaving controllers of the three interleaving controller configuration in FIG. 7A presents the following voltages at the phase port low inputs 702 of elements 700A, 700B, 700C, respectively: [2/3, 1/3, 0/3]$V_{DD}$ at phases [240°, 120°, 0°], respectively.

Referring to FIG. 8A, a conductive connector 821 is coupled to each CLKIO input 811 of each of the four elements 800A-800D. For each element 800, a resistor R and switch 723 can form a voltage loop to connect a phase port high input 801 and phase port low input 802, which is controlled by an enable bypass signal (EN_BP). The enable bypass signal (EN_BP) of FIG. 8A is similar to that of FIG. 7A so details thereof as well as those of the voltage loops of the elements 800 are not repeated for brevity.

The four interleaving controller configuration illustrated in FIGS. 8A and 8B presents the following voltages at the phase port low inputs 802 of elements 800A, 800B, 800C, and 800D, respectively: [3/4, 2/4, 1/4, 0/4] $V_{DD}$ at phases [270°, 180°, 90°, 0°], respectively. FIG. 8B illustrate the resulting interleaved clock signals corresponding to the ICs of FIG. 8A, respectively.

Figure 8C:
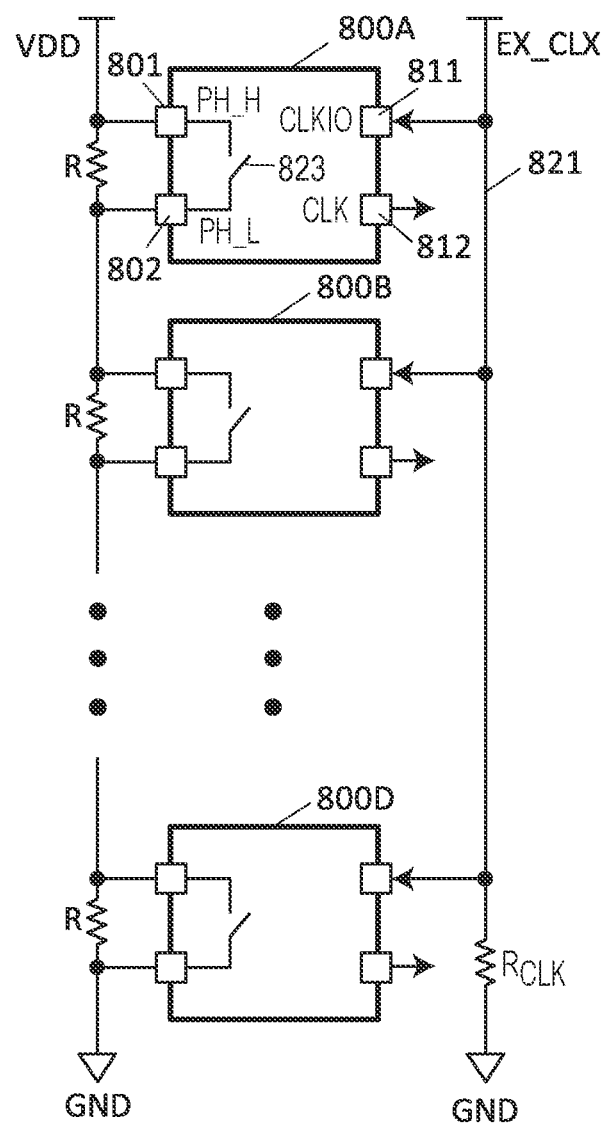
FIG. 8C is a generic schematic circuit diagram of an interleaving arrangement having any number of ICs, in accordance with an example embodiment of the present disclosure.

Embodiments are not limited to two, three, or four interleaving controllers and can include more than four interleaving controllers, where the voltage and phases can be calculated accordingly. FIG. 8C illustrates an arrangement with a generic number of elements.

Figure 9A:
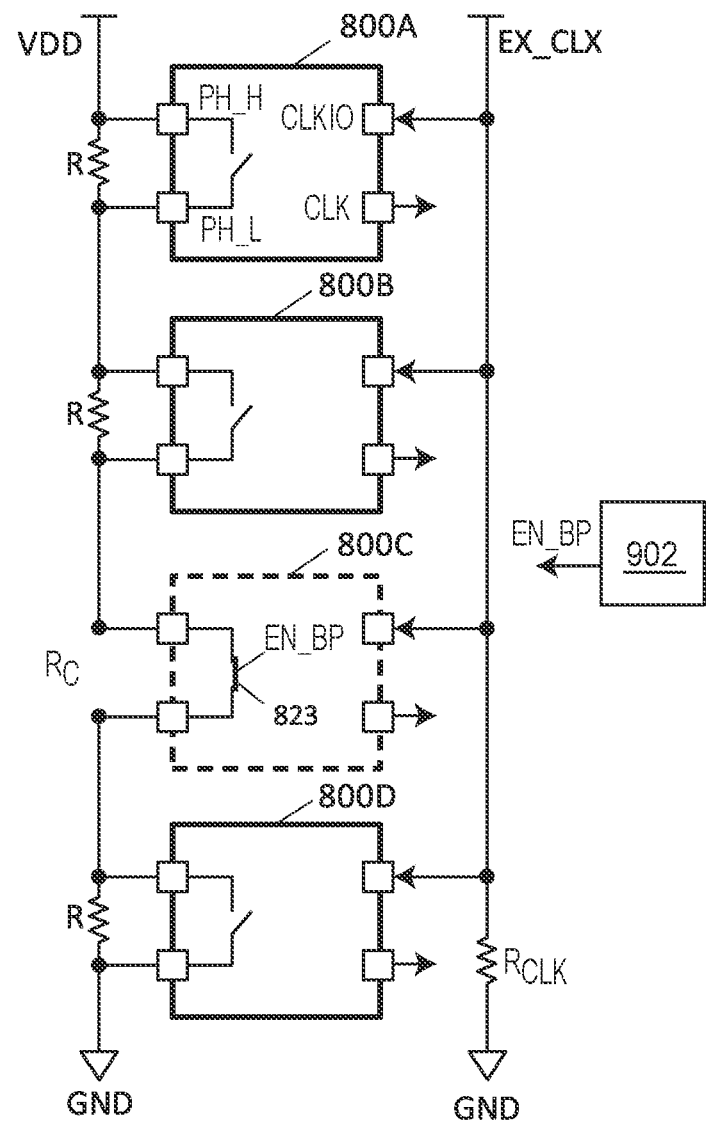
FIG. 9A is a schematic circuit diagram illustrating a dynamic reconfiguration of an interleaving arrangement, in accordance with an example embodiment of the present disclosure.
Figure 9B:
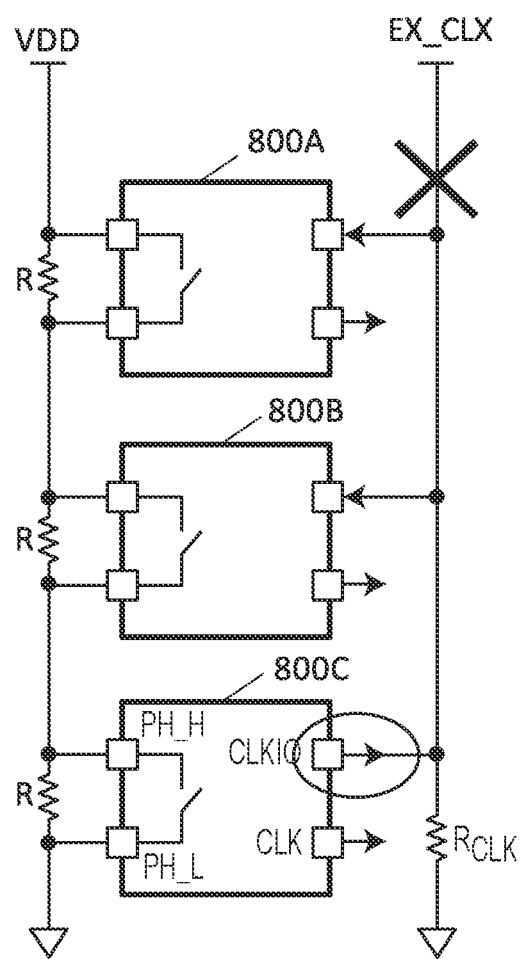
FIGS. 9B and 10 are schematic circuit diagrams illustrating one element sharing its clock with the other elements instead or requiring an external clock, in accordance with other example embodiments of the present disclosure.

As described above, a feature of the multicell power converters of the various embodiments herein includes a reconfigurable hardware interleaving arrangement. As shown in FIGS. 9A and 9B, the four-mode converter of FIGS. 8A and 8B can be dynamically reconfigured as shown. This reconfiguration can result in a system equivalent to the circuit shown in FIG. 7A.

As shown in FIG. 9A, slave elements 800C receives an enable bypass signal (EN_BP) that closes its bypass switch 823. A signal source (not shown) may generate the enable bypass signal (EN_BP) in response to receiving a notification from a sensor or the like indicating that the slave element 800C is non-functional, damaged, or otherwise unavailable for operation.

When the bypass switch 823 is closed, the voltage across the corresponding resistor $R_C$ is at or about 0 volts. Accordingly, three elements 800A, 800B, and 800D are available for operation. The resistor ladder voltages are also similar to those in configurations having three interleaving controllers, for example, shown in FIGS. 7A and 7B. In particular, the slave elements 800 have PH_L voltages of [2/3, 1/3, 1/3 A, and 0/3] $V_{DD}$ and corresponding phase delays of [2/3, 1/3, 1/3 A, 0/3] T, where 1/3 A pertains to the voltage and phase delay of the bypassed element 800C. As a result, the active elements 800A, 800B, 800D are interleaved in a correct manner, i.e., interleaved with an equally spaced phase delays, etc., absent element 800C, which is not present as shown in FIG. 9B.

Referring again to FIG. 8B, the clock output CLK of slave element 800D is in phase with the external clock EX_CLK. In some embodiments, as shown in FIG. 9B, the slave element 800C can operate as a clock master device to provide its clock signal CLK to the clock slave devices 800A, 800B via its bidirectional CLKIO pin. In such embodiments, the state of the module, i.e., master or slave, can be established by the PH_L voltage being at or near ground (0V). In configurations including a clock master device providing a clock signal to clock slave devices, when the master is inactive, i.e., bypassed or failed, an available active interleaving controller having its PH_L voltage equal to GND automatically sends its clock signal to the other interleaving controllers.

Figure 10:
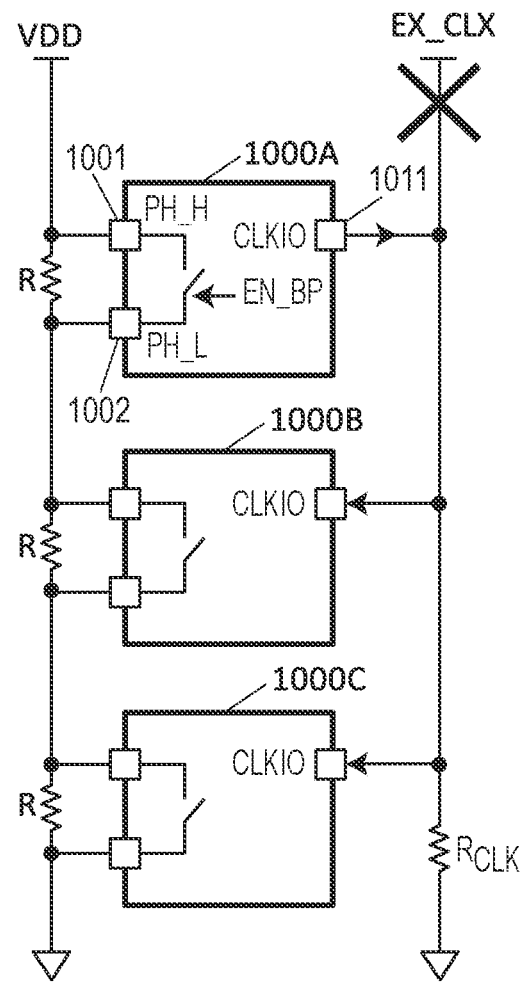

FIG. 10 is a schematic circuit diagram illustrating a dynamic reconfiguration of a multicell converter, in accordance with another example embodiment of the present disclosure. In the alternative arrangement of FIG. 10, the PH_H voltage is used to define the phase delays. In other words, FIG. 10 illustrates element 1000A, by using PH_H voltage=VDD, establishes element 1000A as a master, as distinguished from FIG. 9B, which defines a master 800C as being PH_L=GRD. Accordingly, in FIG. 10, the phase port high (PH_H) inputs 1001 instead of the PH_L inputs 1002 of the interleaving controllers present voltage ratios that are used to select the carriers' phase delays. Here, the element 1000A with the PH_H voltage equal to VDD is configured as the clock master, which provides its clock to the other clock slave elements 1000B, 1000C of the converter.

The interleaving controller of the three interleaving controllers of the configuration in FIG. 10 presents the following voltages and phases of the interleaving arrangement at the phase port high inputs 1001 of elements 1000A, 1000B, 1000C, respectively (from top to bottom): [3/3, 2/3, 1/3]$V_{DD}$ at phases [0°, 240°, 120°], respectively.

Figure 11:
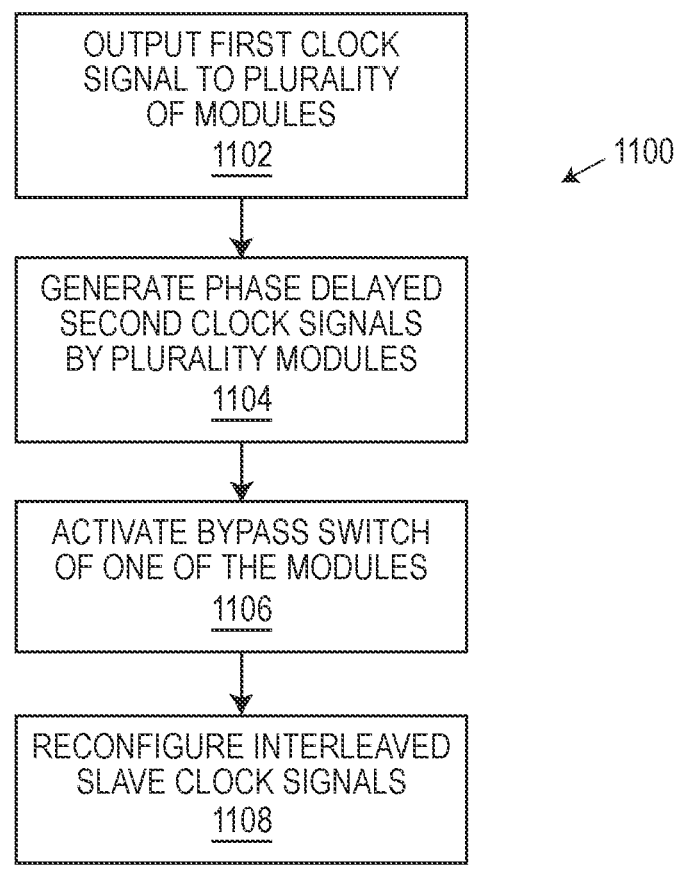
FIG. 11 is a flowchart representation of a reconfigurable hardware interleaving arrangement technique, in accordance with an example embodiment of the present disclosure.

FIG. 11 is a flowchart representation of a reconfigurable hardware interleaving arrangement technique, in accordance with an example embodiment of the present disclosure. In describing a method 1100, reference may be made to hardware components of FIGS. 1-10, which perform the method steps outlined in the flowchart representation.

At block 1102, a first clock signal is output to a plurality of interleaving controllers of a multicell converter, inverter, controller, or other electronic device. In some embodiments, the first clock signal is an external clock (EX_CLK) similar to the clock described in FIGS. 7A-9A. In other embodiments, the first clock signal is a clock signal output from one of the interleaving controllers to the other interleaving controllers, for example, similar to the clock (CLKIO) output from a reconfigured master element 800C in FIG. 9B or clock master element 1000A in FIG. 10.

At block 1104, a plurality of second clock signals are output by the other interleaving controllers. In some embodiments, the second clock signals are clock signals (CLK) output in response to receive of the first clock signal, and have a phase delay relative to the first clock signal, for example, described in FIGS. 7A-8B.

At block 1106, a bypass switch is activated at an interleaving controller, for example, bypass switch 823 of element 800C shown in FIG. 9A. The bypass switch may be activated by receiving a signal from an external source, an internal sensor of the interleaving controller, or other signal source that generates the signal due to a malfunction or detected undesirable status change of the converter module or interleaving controller at which the module operates.

At block 1108, the malfunctioning module is removed from the combination of modules with respect to operation, in particular, by forming a voltage loop that includes the activated bypass switch. In doing so, a reconfiguration operation is performed where the clock signals of the remaining interleaving controllers have equal phase delays, for example, compensating for the unequal phase spacing caused by the inoperable interleaving controller, for example, shown in FIGS. 5A and 5B.

As will be appreciated, embodiments as disclosed include at least the following embodiments. In one embodiment, a power management integrated circuit comprises a modular interleaved clock generator that comprises a plurality of interconnected modular elements, each element constructed to generate and output a clock signal, and each one comprising: a phase port high input; a phase port low input; a clock input; and a bypass switch coupled between the phase port high input and the phase port low input, wherein in response to the bypass switch of at least one of the plurality of elements in a closed state, the phase port high inputs or the phase port low inputs of the remaining elements absent the at least one elements having the bypass switch in the closed state each receives a voltage that interleaves the clock signals output from the remaining N active elements to have an interleaving arrangement that includes equal phase delays.

Alternative embodiments of the power management integrated circuit include one of the following features, or any combination thereof. The modular interleaved clock generator further comprises a resistor ladder including a plurality of serially coupled resistors; and a voltage source that provides a supply voltage to the resistor ladder, wherein each resistor of the resistor ladder is coupled to an element of the plurality of interconnected elements. Each resistor of the resistor ladder is parallel to the bypass switch of an interleaving controller of the plurality of elements to which the resistor ladder is coupled so that the phase port high input of the interleaving controller is coupled to the resistor ladder at one side of the resistor and the phase port low input of the interleaving controller is coupled to the resistor ladder at another side of the resistor. The power management integrated circuit further comprises a direct connection between the phase port high input, phase port low input, and bypass switch of the at least one of the plurality of elements having the bypass switch in the closed state and a resistor of the resister ladder coupled to the at least one of the plurality of elements, wherein the bypass switch and the resistor are external to or integrated with the at least one of the plurality of elements. The clock input of an interleaving controller of the at least one of the plurality of elements operating as a master interleaving controller is a bidirectional clock input/output interface in response to the multiphase controller reconfigured to interleave the clock signals output from remaining interleaving controllers of the plurality of elements absent the interleaving controller having the bypass switch in the closed state. Each of the plurality of elements has a clock signal output constructed and arranged to output the clock signal at a phase delay that forms the interleaving arrangement in response to a clock source that provides an input clock to each clock input. An interleaving controller of the plurality of elements is converted from a slave interleaving controller to the master interleaving controller to output its clock signal from the bidirectional clock input/output interface to the other interleaving controllers when its clock signal is in phase with an external clock signal previously received by the clock inputs of the plurality of interleaving controllers. The at least one of the plurality of elements has an internal phase lock loop that generates the clock signal at a same frequency as a clock signal at the clock input. The power management integrated circuit further comprises a conductive connector coupled to each of the clock inputs of the interleaving controllers to provide the external clock signal to each of the interleaving controllers. The at least one of the plurality of elements having the bypass switch in the closed state controls the remaining elements to rearrange the clock signals to form the interleaving arrangement that includes the equal phase delays. The power management integrated circuit further comprising an external signal source that generates an enable bypass signal that controls a transition of the bypass switch between an open state and the closed state. The phase port high input forms the phase delays of the clock signals. The phase port low input forms the phase delays of the clock signals. One of the elements includes a master interleaving controller that provides the clock signal to other elements of the plurality of elements, and wherein when the master interleaving controller is inactive, another element of the other elements having a phase low voltage at its phase port low input equal to a ground voltage automatically sends its clock signal to the other elements. One of the elements includes a master interleaving controller that provides the clock signal to the other elements, and wherein when the master interleaving controller is inactive, another elements of the other elements having a phase high voltage at its phase port high input equal to a ground voltage automatically sends its clock signal to the other elements.

In another embodiment, an interleaving controller of a clock generator of a power management integrated circuit comprises a phase port high input; a phase port low input; a clock input; and a bypass switch coupled between the phase port high input and the phase port low input, wherein in response to the bypass switch in a closed state, the converter includes a direct connection between the phase port high input, phase port low input, and bypass switch to modify an interleaving arrangement including one or more other interleaving controllers in electronic communication with the interleaving controller.

Alternative embodiments of the interleaving controller includes one of the following features, or any combination thereof. The interleaving arrangement that includes equal phase delays of clocks generated by the other interleaving controllers. The interleaving controller further comprising has a clock signal output constructed and arranged to output a clock signal in response to a signal received at the clock input. The interleaving controller is converted from a slave interleaving controller to a master interleaving controller to output the clock signal from the clock input to the other interleaving controllers when the clock signal is in phase with an external clock signal previously received by the clock inputs of the plurality of interleaving controllers.

In another embodiment, a method for forming a reconfigurable hardware interleaving arrangement for a power management integrated circuit comprises outputting a first clock signal to a plurality of slave interleaving controllers; generating a plurality of second clock signals having a phase delay relative to the first clock signal; activating a bypass switch of at least one of the slave interleaving controllers; and reconfiguring an interleaving arrangement including the phase delays of the second clock signals in response to activating the bypass switch.

A power management integrated circuit comprises a modular interleaved clock generator comprising a plurality of interconnected modular elements, each element constructed to generate and output a clock signal, and each one comprising: a phase port high input; a phase port low input; a clock input; and a bypass switch coupled between the phase port high input and the phase port low input, wherein in response to the bypass switch of at least one of the plurality of elements in a closed state, the phase port high inputs or the phase port low inputs of the remaining elements absent the at least one interleaving controller having the bypass switch in the closed state each receives a voltage that interleaves the clock signals output from the remaining active elements to have an interleaving arrangement that includes equal phase delays.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A power management integrated circuit, comprising:
a modular interleaved clock generator, comprising:
a plurality of interconnected modular elements, each element constructed to generate and output a clock signal, and each one comprising:
a phase port high input;
a phase port low input;
a clock input; and
a bypass switch coupled between the phase port high input and the phase
port low input, wherein in response to the bypass switch of at least one of the plurality of elements in a closed state, the phase port high inputs or the phase port low inputs of the remaining elements, absent the at least one elements having the bypass switch in the closed state, each receives a voltage that interleaves the clock signals output from the remaining active elements to have an interleaving arrangement that includes equal phase delays.

2. The power management integrated circuit of claim 1, wherein
the modular interleaved clock generator further comprises:
a resistor ladder including a plurality of serially coupled resistors; and
a voltage source that provides a supply voltage to the resister ladder, wherein each resistor of the resistor ladder is coupled to an element of the plurality of interconnected elements.

3. The power management integrated circuit of claim 2, further
comprising a direct
connection between the phase port high input, phase port low input, and bypass switch of the at least one of the plurality of elements having the bypass switch in the closed state and a resistor of the resister ladder coupled to the at least one of the plurality of elements, and wherein the bypass switch and the resistor are external to or integrated with the at least one of the plurality of elements.

4. The power management integrated circuit of claim 1, wherein each resistor of the resistor ladder is parallel to the bypass switch of an interleaving controller of the plurality of elements to which the resistor ladder is coupled so that the phase port high input of the interleaving controller is coupled to the resistor ladder at one side of the resistor and the phase port low input of the interleaving controller is coupled to the resistor ladder at another side of the resistor.

5. The power management integrated circuit of claim 1, wherein each of the plurality of elements has a clock signal output constructed and arranged to output the clock signal at a phase delay that forms the interleaving arrangement in response to a clock source that provides an input clock to each clock input.

6. The power management integrated circuit of claim 1, wherein an interleaving controller of the plurality of elements is converted from a slave interleaving controller to the master interleaving controller to output its clock signal from the bidirectional clock input/output interface to the other interleaving controllers when its clock signal is in phase with an external clock signal previously received by the clock inputs of the plurality of interleaving controllers.

7. The power management integrated circuit of claim 1, wherein the at least one of the plurality of elements has an internal phase lock loop that generates the clock signal at a same frequency as a clock signal at the clock input.

8. The power management integrated circuit of claim 1, wherein the at least one of the plurality of elements having the bypass switch in the closed state controls the remaining elements to rearrange the clock signals to form the interleaving arrangement that includes the equal phase delays.

9. The power management integrated circuit of claim 1, further comprising an external signal source that generates an enable bypass signal that controls a transition of the bypass switch between an open state and the closed state.

10. The power management integrated circuit of claim 1, wherein the phase port high input or the phase port low input forms the phase delays of the clock signals.

11. The power management integrated circuit of claim 1, wherein a difference of the phase port high input and phase port low input indicates the number of active elements and the value of a relative phase delay.

12. The power management integrated circuit of claim 1, wherein one of the elements includes a clock master interleaving controller that provides the clock signal to other elements of the plurality of elements, and wherein when the clock master interleaving controller is inactive, another element of the other elements having a phase low voltage at its phase port low input equal to a ground voltage automatically sends its clock signal to the other elements.

13. The power management integrated circuit of claim 1, wherein one of the elements includes a master interleaving controller that provides the clock signal to the other elements, and wherein when the master interleaving controller is inactive, another elements of the other elements having a phase high voltage at its phase port high input equal to a ground voltage automatically sends its clock signal to the other elements.

14. An interleaving controller of a clock generator of a power management integrated circuit, comprising:
 a phase port high input;
 a phase port low input;
 a clock input; and
 a bypass switch coupled between the phase port high input and the phase port low input, wherein in response to the bypass switch in a closed state, the converter includes a direct connection between the phase port high input, phase port low input, and bypass switch to modify an interleaving arrangement including one or more other interleaving controllers in electronic communication with the interleaving controller.

15. The interleaving controller of claim 14, wherein the interleaving arrangement that includes equal phase delays of clocks generated by the other interleaving controllers.

16. The interleaving controller of claim 14, further comprising has a clock signal output constructed and arranged to output a clock signal in response to a signal received at the clock input.

17. The interleaving controller of claim 16, wherein the interleaving controller is converted from a slave interleaving controller to a master interleaving controller to output the clock signal from the clock input to the other interleaving controllers when the clock signal is in phase with an external clock signal previously received by the clock inputs of the plurality of interleaving controllers.

18. A method for forming a reconfigurable hardware interleaving arrangement for a power management integrated circuit, comprising:
 outputting a first clock signal to a plurality of slave interleaving controllers;
 generating a plurality of second clock signals having a phase delay relative to the first clock signal;
 activating a bypass switch of at least one of the slave interleaving controllers; and reconfiguring an interleaving arrangement including the phase delays of the second clock signals in response to activating the bypass switch.

19. The method of claim 18, wherein reconfiguring the hardware interleaving arrangement further comprises hanging one of the plurality of slave interleaving controls to a master among the interleaving controllers.

* * * * *